United States Patent
Oh

(10) Patent No.: US 8,113,141 B2
(45) Date of Patent: Feb. 14, 2012

(54) APPARATUS FOR PROCESSING A SUBSTRATE

(75) Inventor: Chang-Suk Oh, Cheonan-si (KR)

(73) Assignee: Semes Co., Ltd, Chungnam (KR)

( * ) Notice: Subject to any disclaimer, the term of this patent is extended or adjusted under 35 U.S.C. 154(b) by 960 days.

(21) Appl. No.: 12/111,545

(22) Filed: Apr. 29, 2008

(65) Prior Publication Data
US 2008/0308038 A1 Dec. 18, 2008

(30) Foreign Application Priority Data
Jun. 18, 2007 (KR) .................. 10-2007-0059216

(51) Int. Cl.
*B05C 5/02* (2006.01)

(52) U.S. Cl. .................. 118/320; 118/500; 414/222.01; 414/935; 396/611

(58) Field of Classification Search .................. 118/500, 118/319, 52, 56, 320; 414/935, 222.01; 438/758; 396/611
See application file for complete search history.

(56) References Cited

U.S. PATENT DOCUMENTS

| | | | |
|---|---|---|---|
| 5,442,416 A * | 8/1995 | Tateyama et al. | 396/612 |
| 6,027,262 A * | 2/2000 | Akimoto | 396/611 |
| 6,645,355 B2 * | 11/2003 | Hanson et al. | 204/198 |
| 7,128,481 B2 * | 10/2006 | Hashinoki | 396/611 |

FOREIGN PATENT DOCUMENTS

| | | |
|---|---|---|
| CN | 200610007088.5 | 9/2006 |
| CN | 200610128106 | 3/2007 |
| JP | 2004/193597 * | 7/2004 |
| KR | 10-1998-024626 | 7/1998 |
| KR | 1020020036741 A | 5/2002 |
| KR | 100637717 B1 | 10/2006 |

* cited by examiner

*Primary Examiner* — Laura Edwards
(74) *Attorney, Agent, or Firm* — Daly, Crowley, Mofford & Durkee, LLP

(57) ABSTRACT

In a substrate-processing apparatus for performing coating, baking and developing processes on a semiconductor substrate, a first processing block performs a coating process and a developing process. A second processing block is disposed opposite to the first processing block to heat-treat substrates. A main transfer block is disposed between the first and second processing blocks to transfer the substrates. A third processing block is disposed on one side of the main transfer block in a direction perpendicular to an arrangement direction of the first and second processing blocks to adjust a temperature of the substrates. An auxiliary transfer block is disposed adjacent to the second and third processing blocks to transfer the substrates between the second and third processing blocks. Thus, an overload of the main transfer block may be reduced.

22 Claims, 6 Drawing Sheets

APPARATUS FOR PROCESSING A SUBSTRATE

CROSS-REFERENCE TO RELATED APPLICATIONS

This application claims priority under 35 U.S.C. §119 to Korean Patent Application No. 2007-59216, filed on Jun. 18, 2007 in the Korean Intellectual Property Office (KIPO), the contents of which are incorporated herein by reference in their entirety.

BACKGROUND OF THE INVENTION

1. Field of the Invention

The present invention relates to an apparatus for processing a substrate. More particularly, the present invention relates to an apparatus for performing coating, baking and developing processes on a substrate such as a silicon wafer.

2. Description of the Related Art

In a semiconductor processing technology, a photoresist pattern may be used as an etching mask for an etching process, which is performed to form a circuit pattern having electrical characteristics. The photoresist pattern may be formed by a substrate-processing apparatus or a photoresist-pattern-forming apparatus that is connected to an exposure apparatus.

The substrate-processing apparatus may include coating units for forming a bottom anti-reflective coating (BARC) layer and a photoresist layer on substrates, heating units for hardening a BARC layer and a photoresist layer, heating units for performing a post-exposure bake (PEB) process on substrates that are subjected to an exposure process, developing units for performing a developing process on a photoresist layer that are subjected to an exposure process, heating units for hardening photoresist patterns formed on substrates, cooling units for cooling substrates heated by the heating units, transfer stages for receiving substrates, etc.

A substrate-transferring robot may be disposed between the processing units and may transfer the substrates between the processing units in accordance with a predetermined process recipe.

Because the times required for the unit processes may be different from one another, waiting times of the substrates in the processing units or the transfer stages may be increased, and the substrate-transferring robot may be overloaded.

A BARC layer may not be used according to a process recipe, a photoresist composition, a required width of a photoresist pattern, etc. Thus, some coating units may be unnecessary.

As a result, the throughput of the substrate-processing apparatus may be deteriorated, and thus an improved substrate-processing apparatus is needed to solve the above-described problems.

SUMMARY OF THE INVENTION

Example embodiments of the present invention provide a substrate-processing apparatus having an improved throughput.

In an apparatus for processing a substrate according to an aspect of the present invention, the apparatus may include a first processing block performing a coating process and a developing process on substrates, a second processing block disposed opposite to the first processing block to heat-treat the substrates, a main transfer block disposed between the first and second processing blocks to transfer the substrates, a third processing block disposed on one side of the main transfer block in a direction perpendicular to an arrangement direction of the first and second processing blocks to adjust a temperature of the substrates, and an auxiliary transfer block disposed adjacent to the second and third processing blocks to transfer the substrates between the second and third processing blocks.

In some example embodiments of the present invention, the auxiliary transfer block may include a vertical guide rail extending in a vertical direction and a robot arm coupled with the vertical guide rail to move in the vertical direction. The robot arm may be configured to rotate, expand and contract so as to transfer the substrates.

In some example embodiments of the present invention, the second processing block may include first, second and third unit blocks disposed in a horizontal direction and opposite to the first processing block. Each of the first and third unit blocks may include a plurality of heating units disposed in multiple stages to heat the substrates, and the second unit block may include a plurality of heat-treating units disposed in multiple stages between the first and third unit blocks to heat-treat the substrates.

In some example embodiments of the present invention, the auxiliary transfer block may transfer the substrates between the first unit block and the third processing block.

In some example embodiments of the present invention, each of the heat-treating units may include a heating plate configured to heat the substrates, a cooling plate disposed on one side of the heating plate in a direction parallel to an arrangement direction of the first, second and third unit blocks to cool the substrates, and a heat-treating chamber receiving the heating plate and the cooling plate and having a pair of gates to carry the substrates in and out.

In some example embodiments of the present invention, each of the heat-treating units may further include an intra-chamber robot disposed in the heat-treating chamber to transfer the substrates between the heating plate and the cooling plate, and lift pins movably disposed in a vertical direction through each of the heating plate and the cooling plate to load the substrates on the heating plate and the cooling plate and to unload the substrates from the heating plate and the cooling plate.

In some example embodiments of the present invention, the intra-chamber robot may include a guide rail extending in a direction parallel to an arrangement direction of the heating plate and the cooling plate, and a robot arm movably coupled with the guide rail and extending in a direction perpendicular to the guide rail.

In some example embodiments of the present invention, the first processing block may include an upper unit block comprising one of at least one coating unit for forming a layer on the substrates and at least one developing unit for developing a photoresist layer on the substrates, a lower unit block comprising another one of the at least one coating unit and the at least one developing unit, and a middle unit block detachably disposed between the upper and lower unit blocks and comprising at least one of coating units and developing units.

In some example embodiments of the present invention, the upper unit block may include a first coating unit for forming a bottom anti-reflective coating (BARC) layer and a second coating unit for forming a photoresist layer.

In some example embodiments of the present invention, the upper unit block may include a plurality of coating units for forming a photoresist layer on the substrates.

In some example embodiments of the present invention, the main transfer block may include an upper main transfer robot transferring the substrates between the upper unit block, the middle unit block, the second processing block and the third processing block, and a lower main transfer robot transferring the substrates between the lower unit block, the middle unit block, the second processing block and the third processing block.

In some example embodiments of the present invention, each of the upper and lower main transfer robots may include a pair of vertical guide rails extending in a vertical direction, a horizontal guide rail coupled with the vertical guide rails to move in the vertical direction, and a robot arm coupled with the horizontal guide rail to move in a horizontal direction and configured to rotate, expand and contract so as to transfer the substrates.

In some example embodiments of the present invention, the vertical guide rails of the upper main transfer robot and the vertical guide rails of the lower main transfer robot may be disposed adjacent to the first processing block and the second processing block, respectively.

In some example embodiments of the present invention, the robot arm of the upper main transfer robot may be downwardly disposed, and the robot arm of the lower main transfer robot may be upwardly disposed.

In some example embodiments of the present invention, the vertical guide rails of the upper and lower main transfer robots may be disposed adjacent to the first or second processing block.

In some example embodiments of the present invention, the apparatus may further include a robot controller controlling operations of the upper and lower main transfer robots to prevent the upper and lower main transfer robots from interfering with each other in a middle space of the main transfer block adjacent to the middle unit block with each other.

In some example embodiments of the present invention, the main transfer block may include an upper main transfer robot transferring the substrates between the upper unit block, the middle unit block, the second processing block and the third processing block, and a lower main transfer robot transferring the substrates between the lower unit block, the middle unit block, the second processing block and the third processing block. The auxiliary transfer block may include an auxiliary transfer robot transferring the substrates between the second processing block and the third processing block.

In some example embodiments of the present invention, the apparatus may further include a robot controller controlling operations of the upper and lower main transfer robots and the auxiliary transfer robot so that the upper and lower main transfer robots and the auxiliary transfer robot operate complementarily with one another.

In some example embodiments of the present invention, the third processing block may include a plurality of cooling units disposed in multiple stages to cool the substrates.

In some example embodiments of the present invention, the third processing block may further include a transfer stage receiving the substrates. The transfer stage may be disposed between the cooling units to be adjacent to the middle unit block in a horizontal direction.

In some example embodiments of the present invention, the apparatus may further include a fourth processing block disposed opposite to the third processing block centering on the main transfer block to adjust a temperature of the substrates and a second auxiliary transfer block disposed adjacent to the second processing block and the fourth processing block to transfer the substrates between the second processing block and the fourth processing block.

In some example embodiments of the present invention, the apparatus may further include a substrate-transferring module connected with the third processing block to transfer the substrates between a container for receiving the substrates and the third processing block and an interface module connected with the fourth processing block to transfer the substrates between an exposure apparatus and the fourth processing block.

In accordance with the example embodiments of the present invention, while unit processes, for example, a coating process, a baking process, a developing process, and the like, are performed on a substrate-processing apparatus, a load of upper and lower main transfer robots may be sufficiently reduced by auxiliary transfer blocks and intra-chamber robots of heat-treating units. Further, the configuration of a middle unit block of a first processing block may vary according to a process recipe, and a baking process or a photoresist reflow process using a heating plate and a cooling process using a cooling plate may be performed simultaneously or continuously in each of the heat-treating units. As a result, the throughput of the substrate-processing apparatus may be improved.

BRIEF DESCRIPTION OF THE DRAWINGS

Example embodiments of the present invention will become readily apparent along with the following detailed description when considered in conjunction with the accompanying drawings, wherein.

DESCRIPTION OF THE EMBODIMENTS

Figure 1:
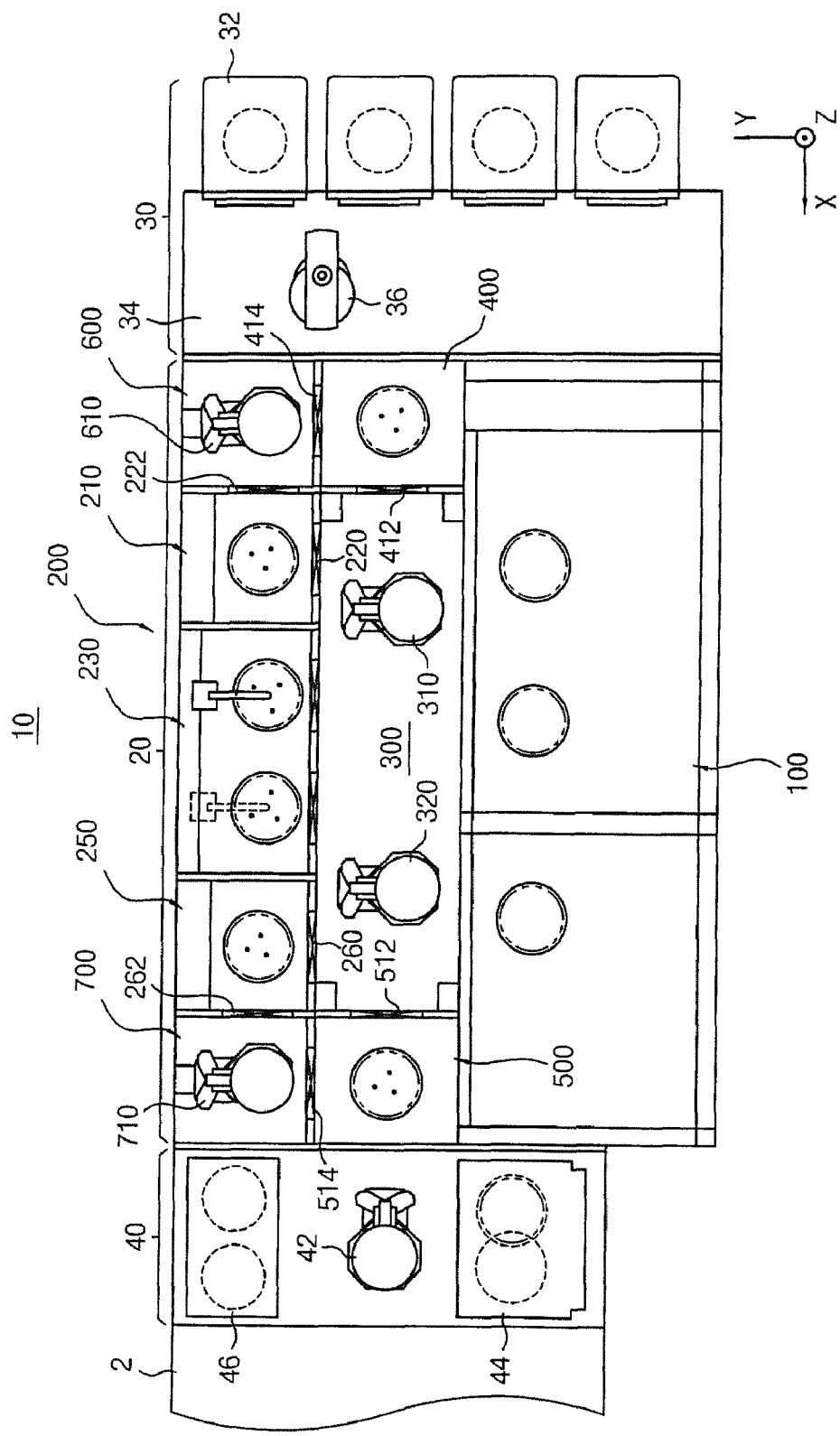
FIG. 1 is a plan view illustrating an apparatus for processing a substrate in accordance with an example embodiment of the present invention.

Embodiments of the invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Figure 2:
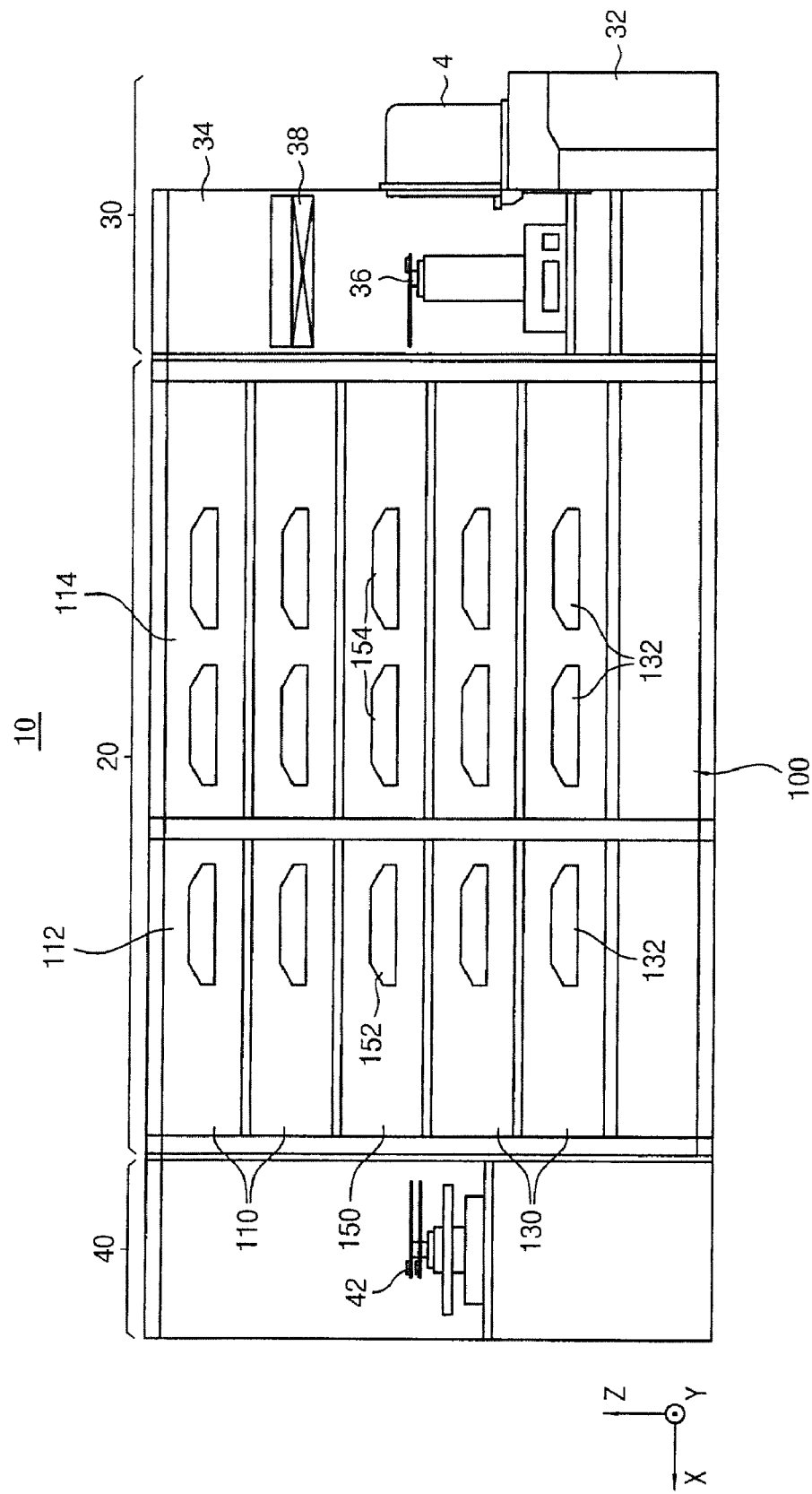
FIG. 2 is a side view illustrating a first processing block of the substrate-processing apparatus shown in FIG. 1.
Figure 3:
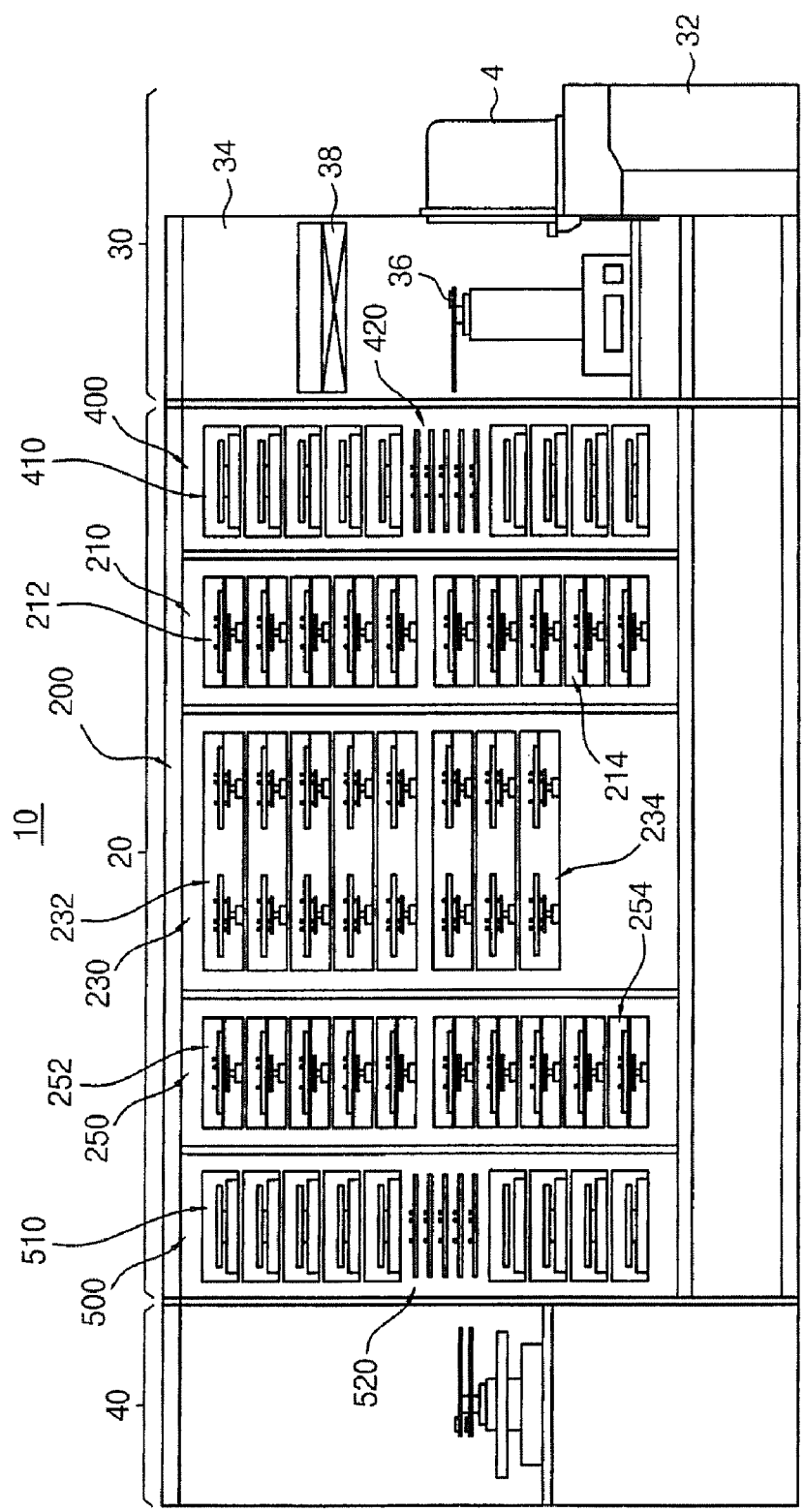
FIG. 3 is a side view illustrating a second processing block of the substrate-processing apparatus shown in FIG. 1.

FIG. 1 is a plan view illustrating an apparatus for processing a substrate in accordance with an example embodiment of the present invention, FIG. 2 is a side view illustrating a first processing block of the substrate-processing apparatus shown in FIG. 1, and FIG. 3 is a side view illustrating a second processing block of the substrate-processing apparatus shown in FIG. 1.

Referring to FIGS. 1 to 3, in accordance with an example embodiment of the present invention, a substrate-processing apparatus 10 may be used to process a semiconductor substrate such as a silicon wafer. For example, the apparatus 10 may be used to perform a coating process for forming a photoresist layer or a bottom anti-reflective coating (BARC) layer on a semiconductor substrate, a developing process for forming a photoresist pattern on a semiconductor substrate after performing an exposure process to transcribe a circuit pattern to a photoresist layer, a baking process for hardening a photoresist layer or a photoresist pattern, and the like.

The substrate-processing apparatus 10 may include a substrate-processing module 20 for processing substrates, a substrate-transferring module 30 for transferring the substrates and an interface module 40 disposed between the substrate-processing module 20 and an exposure apparatus 2.

The substrate-transferring module 30 may include a plurality of load ports 32 for supporting containers 4 in which a plurality of semiconductor substrates is each received, and may transfer the semiconductor substrates between the containers 4 and the substrate-processing module 20. For example, a front-opening unified pod (FOUP) may be placed on each of the load ports.

A substrate-transferring chamber 34 may be connected to the substrate-processing module 20. A substrate-transferring robot 36 may be disposed in the substrate-transferring chamber 34. The substrate-transferring robot 36 may be configured to move in horizontal and vertical directions, for example, in X-axis, Y-axis and Z-axis directions. Further, a robot arm of the substrate-transferring robot 36 may be configured to rotate, expand and contract.

A fan filter unit 38 may be disposed in an upper portion of the substrate-transferring chamber 34 to supply purified air into the substrate-transferring chamber 34. The substrate-transferring module 30 may include door openers (not shown) to open doors of the FOUPs placed on the load ports 32.

The substrate-processing module 20 may include a first processing block 100. The first processing block 100 may coat the semiconductor substrates with a photoresist composition or anti-reflective material to form photoresist layers or BARC layers and may develop photoresist layers on the semiconductor substrates that are subjected to an exposure process by the exposure apparatus 2.

The first processing block 100 may include upper unit blocks 110 and lower unit blocks 130 stacked in multiple stages. The upper unit blocks 110 may include a plurality of coating units, and the lower unit blocks 130 may include a plurality of developing units. On the contrary, the upper unit blocks 110 may include a plurality of developing units, and the lower unit blocks 130 may include a plurality of coating units.

As shown in the figures, the first processing block 100 may include two upper unit blocks 110 and two lower unit blocks 130. However, the scope of the present invention may not be limited by the numbers of the upper and lower unit blocks 110 and 130.

In accordance with an example embodiment of the present invention, each of the upper unit blocks 110 may include a first coating unit 112 for forming a BARC layer and a second coating unit 114 for forming a photoresist layer. The first coating unit 112 may include a rotating chuck for supporting a semiconductor substrate and rotating the semiconductor substrate and a nozzle for supplying an anti-reflective material onto the semiconductor substrate. The second coating unit 114 may include a plurality of rotating chucks for supporting semiconductor substrates and rotating the semiconductor substrates and a plurality of nozzles for supplying a photoresist composition onto the semiconductor substrates. The first and second coating units 112 and 114 may be arranged in the X-axis direction.

In accordance with another example embodiment of the present invention, each of the upper unit blocks 110 may include a plurality of coating units arranged in a horizontal direction, e.g., in the X-axis direction. Each of the coating units may be provided to form a photoresist layer on a semiconductor substrate. Each of the coating units may include a coating chamber in which a coating process is performed, a nozzle for supplying a photoresist composition onto a semiconductor substrate and a rotating chuck for supporting and rotating the semiconductor substrate. Alternatively, a plurality of rotating chucks and a plurality of nozzles may be disposed in one coating chamber.

Each of the lower unit blocks 130 may include a plurality of developing units 132 arranged in the X-axis direction. Each of the developing units 132 may be provided to develop a photoresist layer on a semiconductor substrate that is subjected to an exposure process by the exposure apparatus 2. Each of the developing units 132 may include a developing chamber in which a developing process is performed, a nozzle for supplying a developing solution onto the semiconductor substrate and a rotating chuck for supporting and rotating the semiconductor substrate. Alternatively, a plurality of rotating chucks and a plurality of nozzles may be disposed in one developing chamber. Further, each of the developing units 132 may include a cleaning nozzle to supply a cleaning solution onto the semiconductor substrate after processing the semiconductor substrate by using the developing solution.

In accordance with an example embodiment of the present invention, a middle unit block 150 may be disposed between the upper unit blocks 110 and the lower unit blocks 130. The middle unit block 150 may selectively include coating units and developing units. For example, the middle unit block 150 may include coating units or developing units. Alternatively, the middle unit block 150 may include one coating unit and a plurality of developing units or a plurality of coating units and one developing unit.

As shown in the figures, the middle unit block 150 includes one coating unit 152 and two developing units 154. However, the scope of the present invention may not be limited by the configuration of the middle unit block 150, e.g., the numbers of the coating unit(s) and the developing unit(s).

Particularly, the coating unit(s) and the developing unit(s) of the middle unit block 150 may be detachably disposed between the upper unit blocks 110 and the lower unit blocks 130. That is, the configuration of the middle unit block 150 may vary according to a predetermined process recipe. Thus, the throughput of the substrate-process apparatus 10 may be improved.

The substrate-processing module 20 may include a second processing block 200 opposite to the first processing block 100. The second processing block 200 may include a plurality of unit blocks arranged in the X-axis direction to heat-treat the semiconductor substrates. Particularly, the second processing block 200 may perform a baking process, a photoresist reflow process, a cooling process, and the like. The baking process may be performed to harden a layer on a semiconductor substrate, for example, a photoresist layer, a BARC layer, a photoresist pattern, and the like.

The second processing block 200 may include first, second and third unit blocks 210, 230 and 250. The second unit block 230 may be disposed between the first and third unit blocks 210 and 250. The first and third unit blocks 210 and 250 may include a plurality of heating units 212, 214, 252 and 254 to heat the semiconductor substrates, and the second unit block 230 may include a plurality of heat-treating units 232 and 234 to heat and cool the semiconductor substrates. The heating units 212, 214, 252 and 254 and the heat-treating units 232 and 234 may be stacked in a vertical direction.

Each of the heating units 212, 214, 252 and 254 may include a heating plate for supporting and heating the semiconductor substrate and a heating chamber for receiving the heating plate. Though not specifically shown in the figures, each of the heating units 212, 214, 252 and 254 may further include lift pins movably disposed through the heating plate in a vertical direction to load and unload the semiconductor substrate. A driving section may be disposed under the heating plate, which is connected to the lift pins to move the lift pins in the vertical direction.

The heating units 212, 214, 252 and 254 may be used to perform a hydrophobic process, a soft-baking process, a post-exposure bake (PEB) process, a hard-baking process, and the like.

The hydrophobic process may be performed so that surface characteristics of the semiconductor substrate are changed to have hydrophobic characteristics. For example, some heating units 212, 214, 252 and 254 may each include a nozzle for supplying hexamethyldisilazane (HMDS) gas onto the semiconductor substrate.

The soft-baking process may be performed to remove a solvent from the photoresist layer that is formed on the semiconductor substrate by a photoresist-coating process so as to harden the photoresist layer.

The PEB process may be performed to improve a side surface profile of the photoresist pattern after the exposure process, and the hard-baking process may be performed to harden the photoresist pattern after the developing process.

For example, the first unit block 210 may include first heating units 212 for the hydrophobic process (or a HMDS treatment) and second heating units 214 for the hard-baking process. The third unit block 250 may include third heating units 252 for the soft-baking process and fourth heating units 254 for the PEB process.

The first heating units 212 may be disposed in an upper portion of the first unit block 210, and the second heating units 214 may be disposed in a lower portion of the first unit block 210. The third heating units 252 may be disposed in an upper portion of the third unit block 250, and the fourth heating units 254 may be disposed in a lower portion of the third unit block 250. That is, the first and third heating units 212 and 252 for the hydrophobic process and the soft-baking process may be disposed adjacent to the coating units 112 and 114, and the second and fourth heating units 214 and 254 for the hard-baking process and the PEB process may be disposed adjacent to the developing units 132. However, the scope of the present invention may not be limited by the positions of the heating units 212, 214, 252 and 254.

Figure 4:
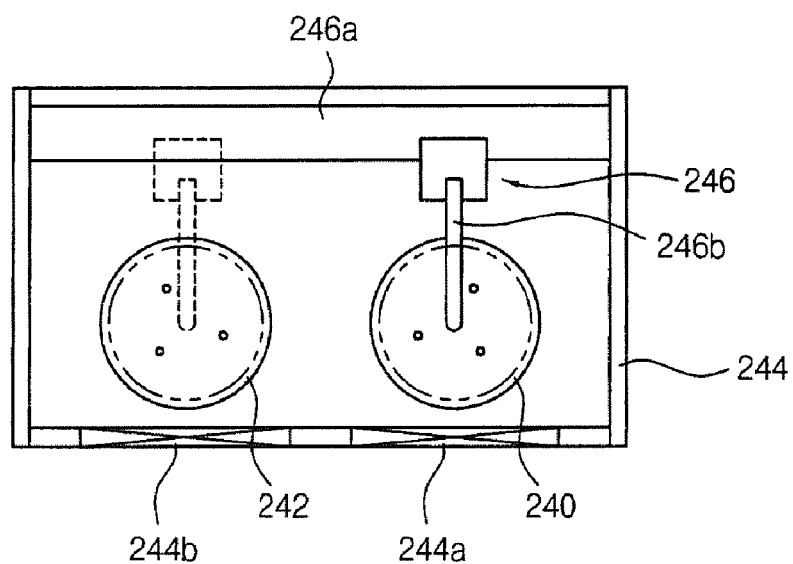
FIG. 4 is a plan view illustrating heat-treating units shown in FIG. 3.
Figure 5:
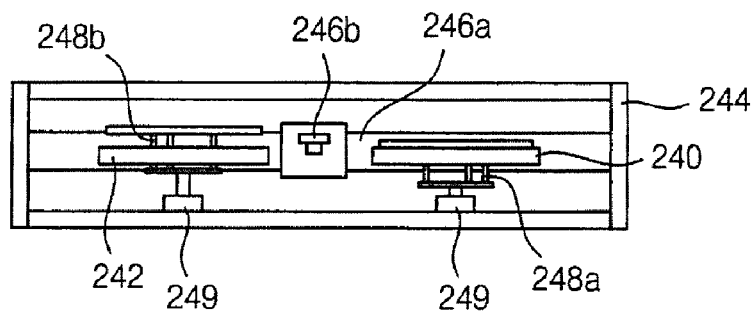
FIG. 5 is a side view illustrating the heat-treating units shown in FIG. 3.

FIGS. 4 and 5 are a plan view and a side view illustrating the heat-treating units shown in FIG. 3.

Referring to FIGS. 4 and 5, each of the heat-treating units 232 and 234 may include a heating plate 240 configured to heat a semiconductor substrate, a cooling plate 242 disposed on one side of the heating plate 240 in the X-axis direction to cool a semiconductor substrate, and a heat-treating chamber 244 configured to receive the heating plate 240 and the cooling plate 242 and having a pair of gates 244a and 244b to carry the semiconductor substrates in and out.

The heat-treating units 232 and 234 may be provided to perform the baking process and the photoresist reflow process on the semiconductor substrates. For example, the second unit block 230 may include upper heat-treating units 232 for performing a baking process and a cooling process to harden a BARC layer and lower heat-treating units 234 for performing a photoresist reflow process and a cooling process.

Further, each of the heat-treating units 232 and 234 may include an intra-chamber robot 246 configured to transfer the semiconductor substrate between the heating plate 240 and the cooling plate 242 in the heat-treating chamber 244.

The intra-chamber robot 246 may include a guide rail 246a for moving a robot arm 246b in the X-axis direction. The robot arm 246b may be movably coupled with the guide rail 246a in the X-axis direction and may extend in the Y-axis direction toward the heating plate 240 and the cooling plate 242.

Though not specifically shown in the figures, each of the heat-treating units 232 and 234 may further include lift pins 248a and 248b disposed movably in a vertical direction through the heating plate 240 and the cooling plate 242. Driving sections 249 may each be disposed under the heating plate 240 and the cooling plate 242 and may be connected with the lift pins 248a and 248b to move the lift pins 248a and 248b in the vertical direction.

The heating plate 240 may be connected with a heater to heat the semiconductor substrate, and the cooling plate 242 may have a cooling line to cool the semiconductor substrate. Particularly, an electric heating wire may be disposed inside the heating plate 240, and a circulating pipe may be disposed inside the cooling plate 242 to circulate a cooling agent.

Further, each of the heating and cooling plates 240 and 242 may have a plurality of protrusions to support the semiconductor substrates. For example, the semiconductor substrates may be apart from the heating and cooling plates 240 and 242 to a height of about 0.1 mm to about 0.3 mm due to the protrusions.

Referring again to FIGS. 1 to 3, a main transfer block 300 may be disposed between the first processing block 100 and the second processing block 200 to transfer the semiconductor substrates. Main transfer robots 310 and 320 may be disposed in the main transfer block 300 to transfer the semiconductor substrates. For example, an upper main transfer robot 310 and a lower main transfer robot 320 may be disposed in the main transfer block 300.

Figure 6:
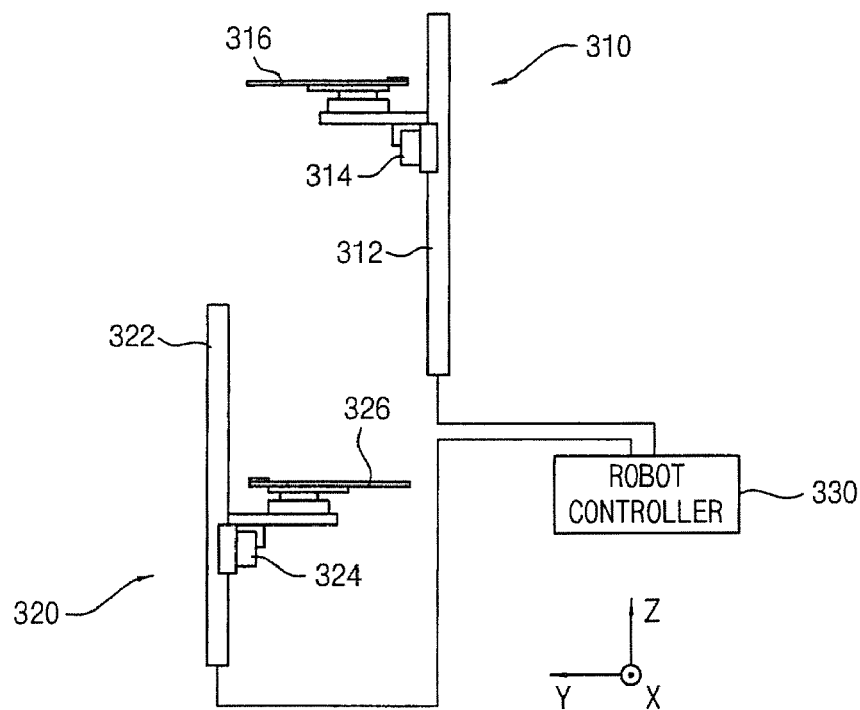
FIG. 6 is a front view illustrating upper and lower transfer robots shown in FIG. 1.
Figure 7:
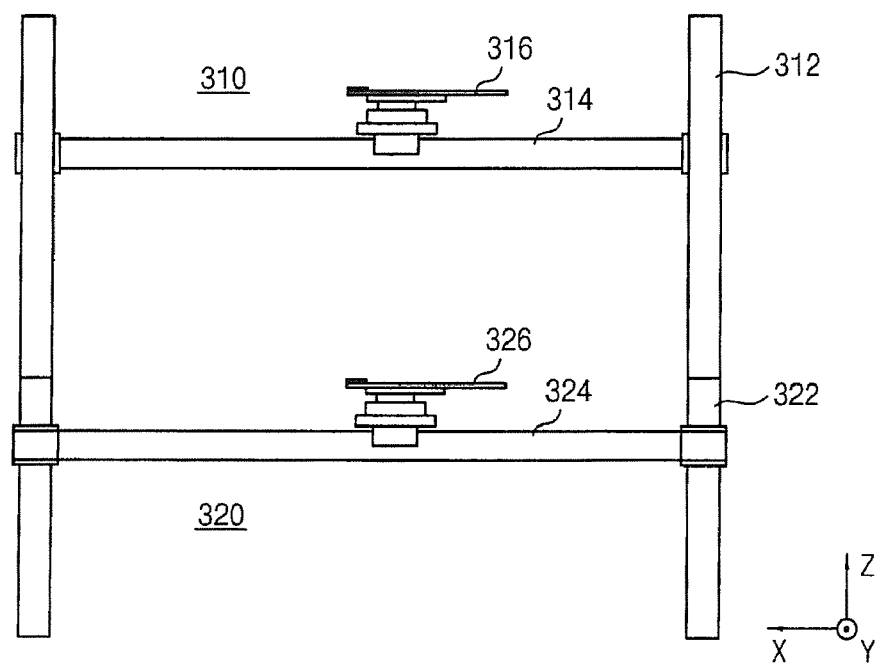
FIG. 7 is a side view illustrating the upper and lower transfer robots shown in FIG. 6.
Figure 8:
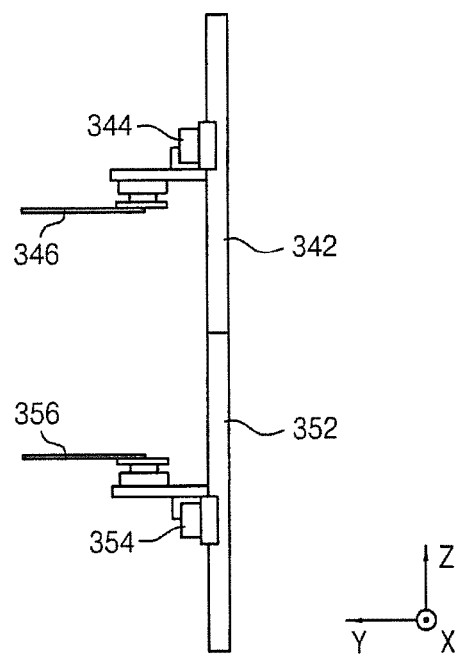
FIG. 8 is a front view illustrating another example of the upper and lower transfer robots shown in FIG. 6.

FIG. 6 is a front view illustrating the upper and lower transfer robots shown in FIG. 1, FIG. 7 is a side view illustrating the upper and lower transfer robots shown in FIG. 6, and FIG. 8 is a front view illustrating another example of the upper and lower transfer robots shown in FIG. 6.

Referring to FIGS. 6 and 7, the upper main transfer robot 310 may include a pair of upper vertical guide rails 312, an upper horizontal guide rail 314 movably coupled with the upper vertical guide rails 312 in a vertical direction and an upper robot arm 316 movably couple with the upper horizontal guide rail 314 in a horizontal direction and configured to rotate, expand and contract to transfer the semiconductor substrates.

The lower main transfer robot 320 may include a pair of lower vertical guide rails 322, a lower horizontal guide rail 324 movably coupled with the lower vertical guide rails 322 in a vertical direction and a lower robot arm 326 movably couple with the lower horizontal guide rail 324 in a horizontal direction and configured to rotate, expand and contract to transfer the semiconductor substrates.

Meanwhile, the substrate-processing module 20 may further include a third processing block 400 and a fourth processing block 500 for adjusting a temperature of the semiconductor substrates. The third and fourth processing blocks 400 and 500 may be disposed on both sides of the main transfer block 300 in a direction perpendicular to an arrangement direction of the first and second processing blocks 100 and 200, i.e., in the X-axis direction. In detail, the third and fourth processing blocks 400 and 500 may each be disposed between the substrate-transferring module 30, the main transfer block 300 and the interface module 40.

The upper main transfer robot 310 may be used to transfer the semiconductor substrates between the first, second, third and fourth processing blocks 100, 200, 400 and 500 prior to the exposure process. Particularly, the upper main transfer robot 310 may be configured to transfer the semiconductor substrates between the upper unit blocks 110, the middle unit block 150, the first and third heating units 212 and 252, the upper heat-treating units 232 and the third and fourth processing blocks 400 and 500.

The lower main transfer robot 320 may be used to transfer the semiconductor substrates between the first, second, third and fourth processing blocks 100, 200, 400 and 500 after the exposure process. Particularly, the lower main transfer robot 320 may be configured to transfer the semiconductor substrates between the lower unit blocks 130, the middle unit block 150, the second and fourth heating units 214 and 254, the lower heat-treating units 234 and the third and fourth processing blocks 400 and 500.

The upper vertical guide rails 312 may be disposed adjacent to the first processing block 100, and the lower vertical guide rails 322 may be disposed adjacent to the second processing block 200. Thus, both of the upper and lower main transfer robots 310 and 320 may carry the semiconductor substrates in and out of the middle unit block 150. When the upper and lower main transfer robots 310 and 320 are operated in an area(s) adjacent to the middle unit block 150, for example, a middle space in the main transfer block 300, operations of the upper and lower main transfer robots 310 and 320 may be controlled by a robot controller 330 to prevent the upper and lower main transfer robots 310 and 320 from interfering with each other.

In accordance with another example embodiment of the present invention, as shown in FIG. 8, an upper robot arm 346 may be coupled with an upper horizontal guide rail 344 to be downwardly disposed, and a lower robot arm 356 may be coupled with a lower horizontal guide rail 354 to be upwardly disposed. In this case, upper vertical guide rails 342 and lower vertical guide rails 352 may be disposed adjacent to the first processing block 100 or the second processing block 200.

Referring again to FIGS. 4 and 5, a semiconductor substrate may be carried in the heat-treating chamber 244 through a first gate 244a of the heat-treating chamber 244 and may then be loaded on the heating plate 240 by the lift pins 248a that are disposed through the heating plate 240. After performing the baking process or the photoresist reflow process on the heating plate 240, the semiconductor substrate may be elevated from the heating plate 240 by the lift pins 248a. The robot arm 246b of the intra-chamber robot 246 may move to under the elevated semiconductor substrate, and the lift pins 248a may then move down so that the semiconductor substrate may be supported by the robot arm 246b of the intra-chamber robot 246. The robot arm 246b on which the semiconductor substrate is supported may move to over the cooling plate 242, and the lift pins 248b may move upwardly through the cooling plate 242 to elevate the semiconductor substrate. After the robot arm 246b turns back, the lift pins 248b may move down to load the semiconductor substrate on the cooling plate 242. The semiconductor substrate may be cooled to a temperature of about 30° C. to about 50° C. on the cooling plate 242 and may be carried out through a second gate 244b of the heat-treating chamber 244.

As described above, since the semiconductor substrate may be transferred by the intra-chamber robot 246 between the heating and cooling plates 240 and 242 in the heat-treating chamber 244, a load of the upper and lower main transfer robots 310 and 320 in the main transfer block 300 may be reduced. Further, another semiconductor substrate may be subjected simultaneously or continuously to the baking process or the photoresist reflow process by the heating plate 240 while the semiconductor substrate is cooled by the cooling plate 242. Thus, the throughput of the substrate-processing apparatus 10 may be increased.

Referring again to FIGS. 1 to 3, the third and fourth processing blocks 400 and 500 may be provided to cool the semiconductor substrates heated by the second processing block 200. For example, the third and fourth processing blocks 400 and 500 may include a plurality of cooling units 410 and 510, respectively, for cooling the semiconductor substrates to a predetermined temperature, for example, to a temperature of about 23° C. The cooling units 410 and 510 may be stacked in multiple stages.

Further, the third and fourth processing blocks 400 and 500 may be used to secondarily cool to a temperature of about 23° C. the semiconductor substrates firstly cooled by the cooling plates 242 of the upper or lower heat-treating units 232 or 234. The cooling plates 242 of the heat-treating units 232 or 234 may firstly cool the semiconductor substrates to a temperature of about 30° C. to about 50° C.

Each of the cooling units 410 and 510 may include a cooling chamber and a cooling plate disposed therein. Though not specifically shown in the figures, a cooling coil may be disposed inside the cooling plate to circulate a cooling agent therethrough so that the cooling plate may be maintained at a temperature of about 23° C.

Each of the cooling units 410 and 510 may include a plurality of lift pins movably disposed through the cooling plate in a vertical direction to load and unload the semiconductor substrate. A driving section may be disposed under the cooling plate and may be connected to the lift pins to move the lift pins in the vertical direction.

Further, the third and fourth processing blocks 400 and 500 may include a first transfer stage 420 and a second transfer stage 520, respectively, to receive the semiconductor substrates. Each of the first and second transfer stages 420 and 520 may be disposed between the cooling units 410 and 510. For example, the first and second transfer stages 420 and 520 may be adjacent to the middle unit block 150 of the first processing block 100 in a horizontal direction. Thus, both of the upper and lower main transfer robots 310 and 320 may transfer the semiconductor substrates via the first and second transfer stages 420 and 520.

Figure 9:
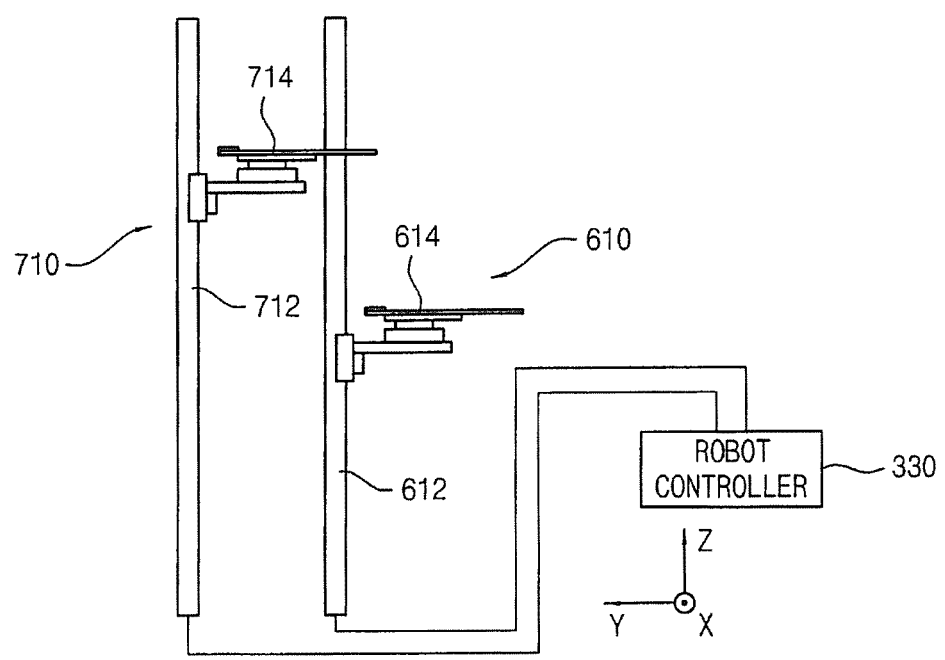
FIG. 9 is a side view illustrating first and second auxiliary transfer robots shown in FIG. 1.

FIG. 9 is a side view illustrating first and second auxiliary transfer robots shown in FIG. 1.

Referring to FIGS. 1 and 9, the substrate-processing module 20 may further include a first auxiliary transfer block 600 and a second auxiliary transfer block 700. The first auxiliary transfer block 600 may be provided to transfer the semiconductor substrates between the third processing block 400 and the first unit block 210 of the second processing block 200, and the second auxiliary transfer block 700 may be provided to transfer the semiconductor substrates between the fourth processing block 500 and the third unit block 250 of the second processing block 200.

The first auxiliary transfer block 600 may be disposed between the third processing block 400, the first unit block 210 and the substrate-transferring module 30 and may include a first auxiliary transfer robot 610 movably disposed in a vertical direction. The first auxiliary transfer robot 610 may include a first vertical guide rail 612 extending in the vertical direction in the first auxiliary transfer block 600 and a first robot arm 614 movably coupled with the first vertical guide rail 612 in the vertical direction. The first robot arm 614 may be configured to rotate, expand and contract to transfer the semiconductor substrates.

The first auxiliary transfer block 600 may be provided to transfer the semiconductor substrates treated by the heating units of the first unit block 210, i.e., the first and second heating units 212 and 214 to the cooling units 410 of the third processing block 400.

Each of the first and second heating units 212 and 214 may have a front gate 220 adjacent to the main transfer block 300 and a side gate 222 adjacent to the first auxiliary transfer block 600. Further, each of the cooling units 410 of the third processing block 400 may have a front gate 412 adjacent to the main transfer block 300 and a side gate 414 adjacent to the first auxiliary transfer block 600.

The semiconductor substrates may be carried in the first unit block 210 through the front gates 220 of the first unit block 210 by the upper and lower main transfer robots 310 and 320, and may be carried out the first unit block 210 through the side gates 222 of the first unit block 210 by the first auxiliary transfer robot 610. Further, the semiconductor substrates may be carried in the third processing block 400 through the side gates 414 of the third processing block 400 by the first auxiliary transfer robot 610. Thus, the load of the first and second main transfer robots 310 and 320 may be reduced, and the throughput of the substrate-processing apparatus 10 may be improved.

The second auxiliary transfer block 700 may be disposed between the fourth processing block 500, the third unit block 250 and the interface module 40 and may include a second auxiliary transfer robot 710 movably disposed in a vertical direction. The second auxiliary transfer robot 710 may include a second vertical guide rail 712 extending in the vertical direction in the second auxiliary transfer block 700 and a second robot arm 714 movably coupled with the second vertical guide rail 712 in the vertical direction. The second robot arm 714 may be configured to rotate, expand and contract to transfer the semiconductor substrates.

The second auxiliary transfer block 700 may be provided to transfer the semiconductor substrates treated by the heating units of the third unit block 250, i.e., the third and fourth heating units 252 and 254 to the cooling units 510 of the fourth processing block 500.

Each of the third and fourth heating units 252 and 254 may have a front gate 260 adjacent to the main transfer block 300 and a side gate 262 adjacent to the second auxiliary transfer block 700. Further, each of the cooling units 510 of the fourth processing block 500 may have a front gate 512 adjacent to the main transfer block 300 and a side gate 514 adjacent to the second auxiliary transfer block 700.

The semiconductor substrates may be carried in the third unit block 250 through the front gates 260 of the third unit block 250 by the upper and lower main transfer robots 310 and 320, and may be carried out the third unit block 250 through the side gates 262 of the third unit block 250 by the second auxiliary transfer robot 710. Further, the semiconductor substrates may be carried in the fourth processing block 500 through the side gates 514 of the fourth processing block 500 by the second auxiliary transfer robot 710. Thus, the load of the first and second main transfer robots 310 and 320 may be reduced, and the throughput of the substrate-processing apparatus 10 may be improved.

In accordance with another example embodiment of the present invention, the semiconductor substrates may be transferred by the upper and lower main transfer robots 310 and 320 from the first unit block 210 to the third processing block 400. Further, the semiconductor substrates may be transferred by the upper and lower main transfer robots 310 and 320 from the third unit block 250 to the fourth processing block 500. That is, the semiconductor substrates may be selectively transferred by the upper main transfer robot 310, the lower main transfer robot 320, the first auxiliary transfer robot 610 and the second auxiliary transfer robot 710, and thus the time required to transfer the semiconductor substrates may be shortened.

Further, the semiconductor substrates treated by the cooling units 410 of the third processing block 400 may be transferred to the first transfer stage 420 by the upper or lower main transfer robot 310 or 320 or the first auxiliary transfer robot 610. The semiconductor substrates treated by the cooling units 510 of the fourth processing block 500 may be transferred to the second transfer stage 520 by the upper or lower main transfer robot 310 or 320 or the second auxiliary transfer robot 710.

Still further, the semiconductor substrates received in the first transfer stage 420 may be transferred to the first unit block 210 or the cooling units 410 of the third processing block 400 by the first auxiliary transfer robot 610. The semiconductor substrates received in the second transfer stage 520 may be transferred to the third unit block 250 or the cooling units 510 of the fourth processing block 500 by the second auxiliary transfer robot 710.

The robot controller 330 may control operations of the first and second auxiliary transfer robots 610 and 710. For example, the robot controller 330 may control the operations of the upper and lower main transfer robots 310 and 320 and the first and second auxiliary transfer robots 610 and 710 so that the upper and lower main transfer robots 310 and 320 and the first and second auxiliary transfer robots 610 and 710 operate complementarily with one another. Thus, an overload of the upper and lower main transfer robots 310 and 320 may be reduced or prevented.

The interface module 40 may be disposed between the fourth processing block 500 and the exposure apparatus 2. An interface robot 42 may be disposed in the interface module 40 to transfer the semiconductor substrates between the substrate-processing module 20 and the exposure apparatus 2. The interface robot 42 may be configured to move in a vertical direction, and a robot arm of the interface robot 42 may be configured to rotate, expand and contract to transfer the semiconductor substrates.

Further, an edge exposure unit 44 and a receiving stage 46 may be disposed in the interface module 40. The edge exposure unit 44 may be provided to remove an edge portion of the photoresist layer from an edge portion of the semiconductor substrate. The semiconductor substrates may stand ready in the receiving stage 46 before or after the exposure process. The edge exposure unit 44 and the receiving stage 46 may be disposed opposite to each other in the Y-axis direction centering on the interface robot 42.

The edge exposure unit 44 may include a rotating chuck for supporting and rotating the semiconductor substrate and a light source for irradiating a light beam onto the edge portion of the semiconductor substrate supported by the rotating chuck.

Meanwhile, the operations of the upper and lower main transfer robots 310 and 320 may be controlled by the robot controller 330. For example, the robot controller 330 may control the operation of the upper and lower main transfer robots 310 and 320 such that the upper and lower main transfer robots 310 and 320 do not interfere with each other in the middle space in the main transfer block 300, i.e., in a space adjacent to the middle unit block 150.

For example, the semiconductor substrate may be received in the first transfer stage 420 by the substrate-transferring robot 36 of the substrate-transferring module 30. The semiconductor substrate may be transferred to one of the first heating units 212 for the hydrophobic process by the upper main transfer robot 310 of the main transfer block 300. The semiconductor substrate may be heated to a temperature of about 85° C. to about 120° C. by the heating plate of the first heating unit 212, and the HMDS gas may be supplied onto the semiconductor substrate.

The semiconductor substrate treated by the first heating unit 212 may be transferred to the third or fourth processing block 400 or 500 by the upper main transfer robot 310 and may then be cooled to a temperature of about 23° C. Alternatively, the semiconductor substrate treated by the first heating unit 212 may be transferred to the third processing block 400 by the first auxiliary transfer robot 610 and may then be cooled to a temperature of about 23° C.

The semiconductor substrate may be transferred from the third or fourth processing block 400 or 500 to one of the first coating units 112 of the upper unit blocks 110 and the coating unit 152 of the middle unit block 150 by the upper main transfer robot 310, and a BARC layer may be formed on the semiconductor substrate.

The semiconductor substrate on which the BARC layer is formed may be transferred to one of the upper heat-treating units 232 of the second unit block 230 by the upper main transfer robot 310. A baking process for hardening the BARC layer (hereinafter referred to as "BARC baking process") and a cooling process may be performed by the upper heat-treating unit 232. Particularly, a first BARC baking process may be performed at a temperature of about 120° C. to about 180° C., and a second BARC baking process may then be performed at a temperature higher than the first BARC baking temperature, for example, at a temperature of 150° C. to about 250° C. by the upper heat-treating unit 232. After performing the BARC baking process, the semiconductor substrate may be transferred from the heating plate 240 onto the cooling plate 242 in the upper heat-treating unit 232 by the intra-chamber robot 246 and may then be cooled to a temperature of about 30° C. to about 50° C. by the cooling plate 242.

The semiconductor substrate treated by the upper heat-treating unit 232 may be transferred to the third or fourth processing block 400 or 500 by the upper main transfer robot 310 and may then be cooled to a temperature of about 23° C.

The semiconductor substrate may be transferred from the third or fourth processing block 400 or 500 to one of the second coating units 114 of the upper unit blocks 110 and the coating unit 152 of the middle unit block 150 by the upper main transfer robot 310, and a photoresist layer may then be formed on the semiconductor substrate by the second coating unit 114 or the coating unit 152.

The semiconductor substrate on which the photoresist layer is formed may be transferred to one of the third heating units 252 of the third unit block 250 by the upper main transfer robot 310, and a soft-baking process may then be performed on the semiconductor substrate by the third heating unit 252. For example, the semiconductor substrate may be heated to a temperature of about 70° C. to about 120° C. by the third heating unit 252.

After performing the soft-baking process, the semiconductor substrate may be transferred to the fourth processing block 500 by the upper main transfer robot 310 or the second auxiliary transfer robot 710 and may then be cooled to a temperature of about 23° C. by one of the cooling units 510 of the fourth processing block 500.

The semiconductor substrate cooled by the cooling unit 510 of the fourth processing block 500 may be transferred to the second transfer stage 520 by the upper main transfer robot 310 or the second auxiliary transfer robot 710 and may then be transferred to the exposure apparatus 2 or the edge exposure unit 44 by the interface robot 42.

The semiconductor substrate treated by the exposure apparatus 2 may be transferred to the second transfer stage 520 by the interface robot 42 and may then be transferred to one of the fourth heating units 254 by the lower main transfer robot 320 or the second auxiliary transfer robot 710.

A PEB process may be performed on the semiconductor substrate by the fourth heating unit 254. For example, the semiconductor substrate may be heated to a temperature of about 90° C. to about 150° C. by the fourth heating unit 254.

The semiconductor substrate subjected to the PEB process may be transferred from the fourth heating unit 254 to one of the cooling units 410 and 510 of the third and fourth blocks 400 and 500 by the lower main transfer robot 320 and may then be cooled to a temperature of about 23° C. by the cooling unit 410 or 510. Alternatively, the semiconductor substrate subjected to the PEB process may be transferred from the fourth heating unit 254 to one of the cooling units 510 of the fourth processing block 500 by the second auxiliary transfer robot 710 and may then be cooled to a temperature of about 23° C. by the cooling unit 510.

The semiconductor substrate may be transferred from the third or fourth processing block 400 or 500 to one of the developing units 132 and 154 of the lower unit blocks 130 and the middle unit block 150 by the lower main transfer robot 320, and a developing process may then be performed to form a photoresist pattern on the semiconductor substrate by the developing unit 132 or 154.

The semiconductor substrate subjected to the developing process may be transferred to one of the second heating units 214 of the first unit block 210 by the lower main transfer robot 320, and a hard-baking process may then be performed by the second heating unit 214. For example, the semiconductor substrate may be heated to a temperature of about 110° C. to about 150° C. by the second heating unit 214.

Alternatively, the semiconductor substrate subjected to the developing process may be transferred to one of the lower heat-treating units 234 by the lower main transfer robot 320, and a photoresist reflow process may then be performed by the lower heat-treating unit 234. For example, the semiconductor substrate may be heated to a temperature of about 150° C. to about 180° C. by the heating plate 240 of the lower heat-treating unit 234. The semiconductor substrate subjected to the photoresist reflow process may be transferred from the heating plate 240 to the cooling plate 242 in the lower heat-treating unit 234 by the intra-chamber robot 246 of the lower heat-treating unit 234. Then, the semiconductor substrate may be cooled to a temperature of about 30° C. to about 50° C. by the cooling plate 242.

The semiconductor substrate subjected to the hard-baking process or the photoresist reflow process may be transferred to one of the cooling units 410 of the third processing block 400 by the lower main transfer robot 320 or the first auxiliary transfer robot 610 and may then be cooled to a temperature of about 23° C. the cooling unit 410.

The semiconductor substrate may be transferred from the cooling unit 410 to the first transfer stage 420 of the third processing block 400 by the lower main transfer robot 320 or the first auxiliary transfer robot 610 and may then be carried out the substrate-processing apparatus 10 by the substrate-transferring robot 36.

In this case, ranges of the temperatures of the baking processes and the photoresist reflow process may vary in accordance with the photoresist composition and the anti-reflective material used in the unit processes, a desired width of the photoresist pattern, etc., and the scope of the present invention may not be limited by the temperature ranges.

The unit processes may be sequentially performed on one semiconductor substrate. Alternatively, the unit processes may be simultaneously performed on a plurality of semiconductor substrates. While performing the unit processes, the operations of the upper and lower main transfer robots 310 and 320 may be controlled by the robot controller 330 to prevent the upper and lower main transfer robots 310 and 320 from interfering with each other, and the intra-chamber robots 246 of the heat-treating units 232 and 234 may reduce the load of the upper and lower main transfer robots 310 and 320. Further, the load of the upper and lower main transfer robots 310 and 320 may be increasingly reduced by the first and second auxiliary transfer robots 610 and 710.

In accordance with example embodiments of the present invention, while unit processes, such as a coating process, a baking process, a developing process, a cooling process, and the like, are performed in a substrate-processing apparatus, a load of upper and lower main transfer robots may be reduced by first and second auxiliary transfer robots and intra-chamber robots of heat-treating units.

Further, the configuration of a middle unit block of a first processing block may vary according to a process recipe, and a baking process or a photoresist reflow process using a heating plate and a cooling process using a cooling plate may be performed simultaneously or continuously in the heat-treating units.

As a result, the throughput of the substrate-processing apparatus may be improved by reducing the load of the upper and lower main transfer robots and varying the configuration of the middle unit block.

Although the example embodiments of the present invention have been described, it is understood that the present invention should not be limited to these example embodiments but various changes and modifications can be made by those skilled in the art within the spirit and scope of the present invention as hereinafter claimed.

What is claimed is:

1. An apparatus for processing a substrate comprising:
a first processing block performing a coating process and a developing process on substrates;
a second processing block disposed opposite to the first processing block to heat-treat the substrates;
a main transfer block disposed between the first and second processing blocks to transfer the substrates;
a third processing block disposed on one side of the main transfer block in a direction perpendicular to an arrangement direction of the first and second processing blocks to adjust a temperature of the substrates; and
an auxiliary transfer block disposed adjacent to the second and third processing blocks to transfer the substrates between the second and third processing blocks,
wherein, the first processing block comprises:
an upper unit block comprising one of at least one coating unit for forming a layer on the substrates and at least one developing unit for developing a photoresist layer on the substrates;
a lower unit block comprising the other one of the at least one coating unit and the at least one developing unit; and a middle unit block detachably disposed between the upper and lower blocks and comprising at least one of a coating unit and a developing unit.

2. The apparatus of claim 1, wherein the auxiliary transfer block comprises a vertical guide rail extending in a vertical direction and a robot arm coupled with the vertical guide rail to move in the vertical direction and configured to rotate, expand and contract so as to transfer the substrates.

3. The apparatus of claim 1, wherein the second processing block comprises first, second and third unit blocks disposed in a horizontal direction and opposite to the first processing block,
each of the first and third unit blocks comprises a plurality of heating units disposed in multiple stages to heat the substrates, and
the second unit block comprises a plurality of heat-treating units disposed in multiple stages between the first and third unit blocks to heat-treat the substrates.

4. The apparatus of claim 3, wherein the auxiliary transfer block transfers the substrates between the first unit block and the third processing block.

5. The apparatus of claim 3, wherein each of the heat-treating units comprises:
a heating plate configured to heat the substrates;
a cooling plate disposed on one side of the heating plate in a direction parallel to an arrangement direction of the first, second and third unit blocks to cool the substrates; and
a heat-treating chamber receiving the heating plate and the cooling plate and having a pair of gates to carry the substrates in and out.

6. The apparatus of claim 5, wherein each of the heat-treating units further comprises:
an intra-chamber robot disposed in the heat-treating chamber to transfer the substrates between the heating plate and the cooling plate; and
lift pins movably disposed in a vertical direction through each of the heating plate and the cooling plate to load the substrates on the heating plate and the cooling plate and to unload the substrates from the heating plate and the cooling plate.

7. The apparatus of claim 6, wherein the intra-chamber robot comprises:
a guide rail extending in a direction parallel to an arrangement direction of the heating plate and the cooling plate; and
a robot arm movably coupled with the guide rail and extending in a direction perpendicular to the guide rail.

8. The apparatus of claim 1, wherein the upper unit block comprises a first coating unit for forming a bottom anti-reflective coating layer and a second coating unit for forming a photoresist layer.

9. The apparatus of claim 1, wherein the upper unit block comprises a plurality of coating units for forming a photoresist layer on the substrates.

10. The apparatus of claim 1, wherein the main transfer block comprises:
an upper main transfer robot transferring the substrates between the upper unit block, the middle unit block, the second processing block and the third processing block, and
a lower main transfer robot transferring the substrates between the lower unit block, the middle unit block, the second processing block and the third processing block.

11. The apparatus of claim 10, wherein each of the upper and lower main transfer robots comprises:
a pair of vertical guide rails extending in a vertical direction;
a horizontal guide rail coupled with the vertical guide rails to move in the vertical direction; and
a robot arm coupled with the horizontal guide rail to move in a horizontal direction and configured to rotate, expand and contract so as to transfer the substrates.

12. The apparatus of claim 11, wherein the vertical guide rails of the upper main transfer robot and the vertical guide rails of the lower main transfer robot are disposed adjacent to the first processing block and the second processing block, respectively.

13. The apparatus of claim 11, wherein the robot arm of the upper main transfer robot is downwardly disposed, and the robot arm of the lower main transfer robot is upwardly disposed.

14. The apparatus of claim 13, wherein the vertical guide rails of the upper and lower main transfer robots are disposed adjacent to the first or second processing block.

15. The apparatus of claim 10, further comprising a robot controller controlling operations of the upper and lower main transfer robots to prevent the upper and lower main transfer robots from interfering with each other in a middle space of the main transfer block adjacent to the middle unit block with each other.

16. The apparatus of claim 1, wherein the main transfer block comprises an upper main transfer robot transferring the substrates between the upper unit block, the middle unit block, the second processing block and the third processing block, and a lower main transfer robot transferring the substrates between the lower unit block, the middle unit block, the second processing block and the third processing block, and the auxiliary transfer block comprises an auxiliary transfer robot transferring the substrates between the second processing block and the third processing block.

17. The apparatus of claim 16, further comprising a robot controller controlling operations of the upper and lower main transfer robots and the auxiliary transfer robot so that the upper and lower main transfer robots and the auxiliary transfer robot operate complementarily with one another.

18. The apparatus of claim 1, wherein the third processing block comprises a plurality of cooling units disposed in multiple stages to cool the substrates.

19. The apparatus of claim 18, wherein the third processing block further comprises a transfer stage receiving the substrates, and wherein the transfer stage is disposed between the cooling units to be adjacent to the middle unit block in a horizontal direction.

20. The apparatus of claim 1, further comprising:
a fourth processing block disposed opposite to the third processing block centering on the main transfer block to adjust a temperature of the substrates; and
a second auxiliary transfer block disposed adjacent to the second processing block and the fourth processing block to transfer the substrates between the second processing block and the fourth processing block.

21. The apparatus of claim 20, further comprising: a substrate-transferring module connected with the third processing block to transfer the substrates between a container for receiving the substrates and the third processing block; and an interface module connected with the fourth processing block to transfer the substrates between an exposure apparatus and the fourth processing block.

22. The apparatus of claim 1 wherein the second processing block comprising at least one heat treating unit, and
wherein the third processing block comprising a temperature adjusting device.

* * * * *